United States Patent
Duvvury et al.

[11] Patent Number: 6,064,249
[45] Date of Patent: May 16, 2000

[54] LATERAL DMOS DESIGN FOR ESD PROTECTION

[75] Inventors: Charvaka Duvvury, Plano; Fred Carvajal, Fairview; David Briggs, Dallas, all of Tex.

[73] Assignee: Texas Instruments Incorporated, Dallas, Tex.

[21] Appl. No.: 09/098,931

[22] Filed: Jun. 17, 1998

Related U.S. Application Data

[60] Provisional application No. 60/050,339, Jun. 20, 1997.

[51] Int. Cl.⁷ ..................................... H04H 9/04
[52] U.S. Cl. .......................... 327/314; 327/330
[58] Field of Search ................... 327/314, 315, 327/319, 320, 321, 324, 325, 330, 465, 471; 361/91.5, 91.7

[56] References Cited

U.S. PATENT DOCUMENTS 5,654,863  8/1997  Davies ..................................... 361/111
5,767,550  6/1998  Calafut et al. .......................... 257/355
5,917,220  6/1999  Waggoner ............................... 257/360

OTHER PUBLICATIONS

1997 IEEE, IEDM 97–375, "Lateral DMOS Design for ESD Robustness," pp. 14.7.1–14.7.4 (Charvaka Duvvury, Fred Carvajal, Clif Jones and David Briggs).

*Primary Examiner*—Tuan T. Lam
*Attorney, Agent, or Firm*—Jacqueline J. Garner; Wade James Brady; Frederick J. Telecky, Jr.

[57] ABSTRACT

A LDMOS having improved ESD reliability and a method for designing such a LDMOS. A higher gate clamp voltage and/or minimized drain clamp voltage is used to maximize the ESD performance of the LDMOS. Given a set of design parameters, one or more of the gate clamp voltage, drain clamp voltage, or size of the LDMOS are optimized to meet the design parameters while achieving the optimum ESD performance.

17 Claims, 4 Drawing Sheets

LATERAL DMOS DESIGN FOR ESD PROTECTION

This application claims priority under 35 USC § 119 (e)(1) of provisional application number 60/050,339, filed Jun. 20, 1997.

FIELD OF THE INVENTION

The invention is generally related to the field of ESD protection and more specifically to lateral DMOS transistors designed for improved ESD protection.

BACKGROUND OF THE INVENTION

Smart Power Chips built with low/high voltage CMOS transistors are a significant part of the semiconductor technology for automotive applications. In automotive applications, the harsh environment demands robust protection against the threat of electrostatic discharge (ESD) or other transient pulses such as load dump. Automotive applications typically require a high human body model (HBM) stress level of protection at +/−2000 V. Unfortunately, many power MOSFET device designs are unable to meet this requirement.

One transistor structure used in power devices is the lateral DMOS (LDMOS). A prior art LDMOS is shown in FIG. 1. LDMOS 10 is located in substrate 12 and isolated from other structures (not shown) by field oxide region 14. The drain region 18 of LDMOS 10 is located in a high voltage tank region 16. The source region 22 is located in a p-well 20. The gate electrode 24 extends from the source region 22 over a thin gate oxide 26 and partially over a thicker oxide 28 located adjacent the drain region 18. Unfortunately, achieving acceptable levels of ESD protection with this LDMOS has been very difficult.

A typical circuit application for the LDMOS of FIG. 1 is shown in FIG. 2. A drain clamp (Zener diodes 30) and a gate clamp (Zener diode 32) are used to prevent the LDMOS 10 from entering bipolar breakdown when transient peaks occur at the drain 18 (from pad 34). This ensures that the LDMOS operates as a MOS device. FIG. 3 is a graph of drain current versus gate voltage for a 2400 micron device having a Vds of 20 V. As can be seen from curve 40, in normal operation, increasing the gate voltage above 6–8 volts causes a negligible increase in drain current. Since increasing the gate voltage above 6–8 volts requires extra Zener diodes (using more circuit area) and only a small increase in performance under normal operating conditions, the gate clamps are typically designed for the <8 volt range.

SUMMARY OF THE INVENTION

The invention is a LDMOS having improved ESD reliability and a method for designing such a LDMOS. A higher gate clamp voltage and/or minimized drain clamp voltage is used to maximize the ESD performance of the LDMOS. Given a set of design parameters, one or more of the gate clamp voltage, drain clamp voltage, or width of the LDMOS are optimized to meet the design parameters while achieving the optimum ESD performance.

An advantage of the invention is providing a LDMOS output circuit having improved ESD reliability.

Another advantage of the invention is providing a LDMOS output circuit having improved ESD reliability while consuming the minimum space.

These and other advantages will be apparent to those of ordinary skill in the art having reference to the specification in conjunction with the drawings.

DETAILED DESCRIPTION OF THE EMBODIMENTS

The invention will now be described in conjunction with an output design of a LDMOS using Zener clamps. It will be apparent to those of ordinary skill in the art that the general concepts and advantages of the invention may be applied to improving the ESD reliability of other devices and device applications.

Figure 4:
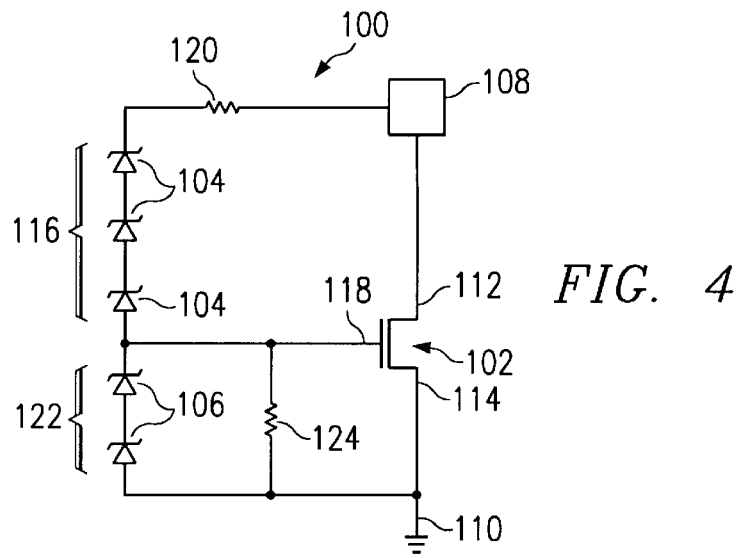
FIG. 4 is a schematic diagram of a LDMOS output circuit according to the invention.

An output circuit 100 including a LDMOS transistor 102 and Zener clamps (104–106) according to the invention is shown in FIG. 4. The drain 112 of LDMOS transistor 102 is connected to the output pad 108 and the source 114 of LDMOS transistor 102 is connected to a source potential 110 (typically ground). A drain clamp 116, consisting of one or more Zener diodes 104, is connected between drain 112 and the gate 118 of LDMOS transistor 102. A first resistor 120 may be connected between the drain 112 and the drain clamp 116. First resistor 120 is a relatively small resistor (e.g. ~100 ohms). Its purpose is to slow down the charging of gate 118 to ensure that the LDMOS uniformly turns-on. This becomes important when a multi-fingered layout is used to form LDMOS 102. A gate clamp 122, consisting or one or more Zener diodes 106, is connected between the gate 118 and the source potential 110. A second resistor 124 may be connected between the gate 118 and source potential 110. Resistor 124 is a relatively large resistor (e.g. on the order of 10 k-ohms) and its purpose is discharge the gate 118 after an initial ESD pulse so that the protected circuit can continue normal operation.

Figure 3:
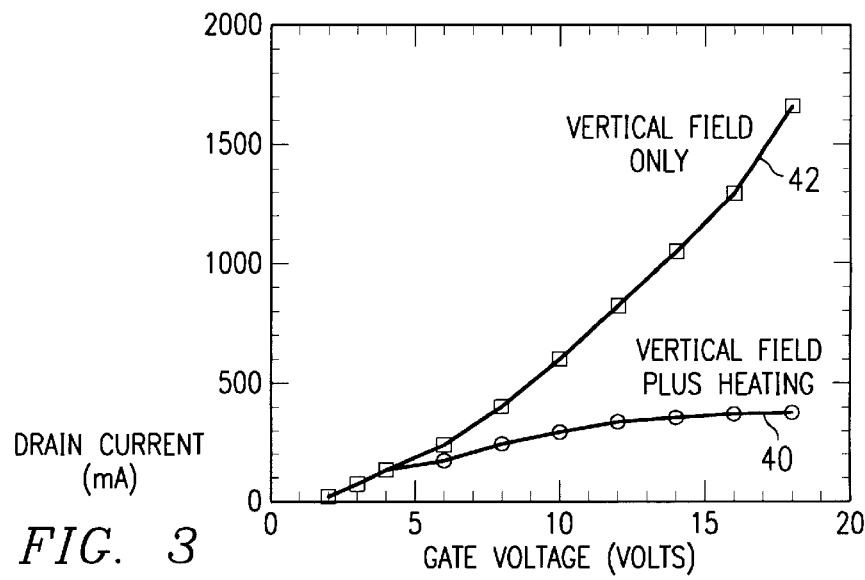
FIG. 3 is a graph of drain current versus gate voltage for a 2400 micron LDMOS transistor with a VDS of 20 V.

Referring back to the graph of FIG. 3, as discussed in the background, there is only minimal increase in the drain current of a 2400 micron LDMOS for increases in gate voltage above the 6–8 V range in normal operation. This is due to the fact that channel heating considerably degrades the mobility. However, under ESD conditions (~100 ns) this channel heating effect is minimal resulting in much higher current levels for higher gate drive voltages, as shown in curve 42. Under ESD the only limiting effects are the vertical and lateral fields. Thus, the LDMOS can conduct much higher current levels and this behavior under ESD can be used to optimize the LDMOS ESD performance.

A key to the invention is in determining the optimum values for the gate clamp voltage, drain clamp voltage, and width of LDMOS 102 using the principle that the LDMOS can conduct much higher levels of current under ESD conditions than in normal operation. A method for optimizing the design parameters will now be described.

Figure 5:
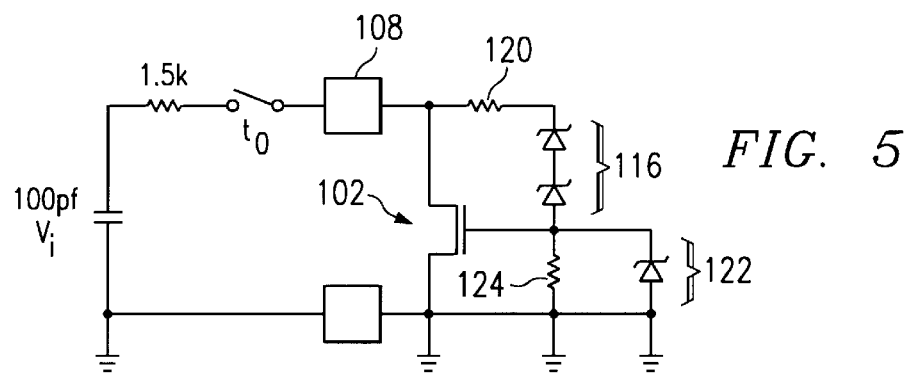
FIG. 5 is a circuit diagram for characterizing the invention.

First, the LDMOS transistor is characterized under 100 ns pulses to represent ESD conditions. Referring to FIG. 5, the pulses are applied to the drain pad 108 using circuit 150. The voltage level, Vi, matches the ESD levels of concerns (e.g., +/−2 kV or +/−4 kV). This allows the MOS conduction to be truly assessed under ESD. The information obtained can be used to estimate the maximum ESD current capability for a given gate clamp design.

Next, the LDMOS transistor is characterized for various drain and gate voltage clamps to evaluate the power dissipation limits under ESD stress. The protection level is determined by increasing the ESD voltage stress until a change in leakage current at the drain pad 108 is observed.

Based on the data obtained in the above two steps, an empirical equation is derived to relate the ESD protection level as a function of gate and drain voltages and device width. The following formula was obtained using this process:

$$V(ESD-HBM)=[0.5W(Vg-Vt)^2]/[(1+0.1(Vg-Vt))Vd]$$

where W is the device width in microns, Vg and Vd are the gate and drain clamps in volts, Vt is the threshold voltage in volts, and V(ESD−HBM) is the HBM level in volts. It should be noted that this relation will depend on the LDMOS technology.

Figure 6:
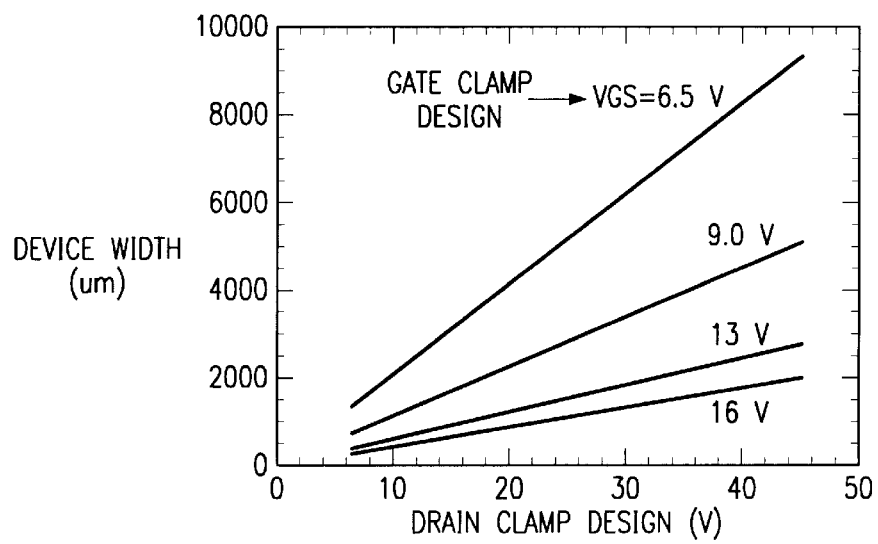
FIG. 6 is a graph of device width versus drain clamp design for various gate clamp voltages.

Using this formula, practical ESD design curves to achieve 2 kV HBM are shown in FIG. 6. Thus, for a given drain and gate clamp design, the required minimum device width can be determined. Or, for a given drain clamp and device width, the minimum gate clamp voltage can be determined or given the gate clamp voltage and device width, the maximum drain clamp voltage can be determined. Similar curves can be generated for the machine model. This procedure allows the designers to properly select the LDMOS width for maximizing the area efficiency.

Figure 7:
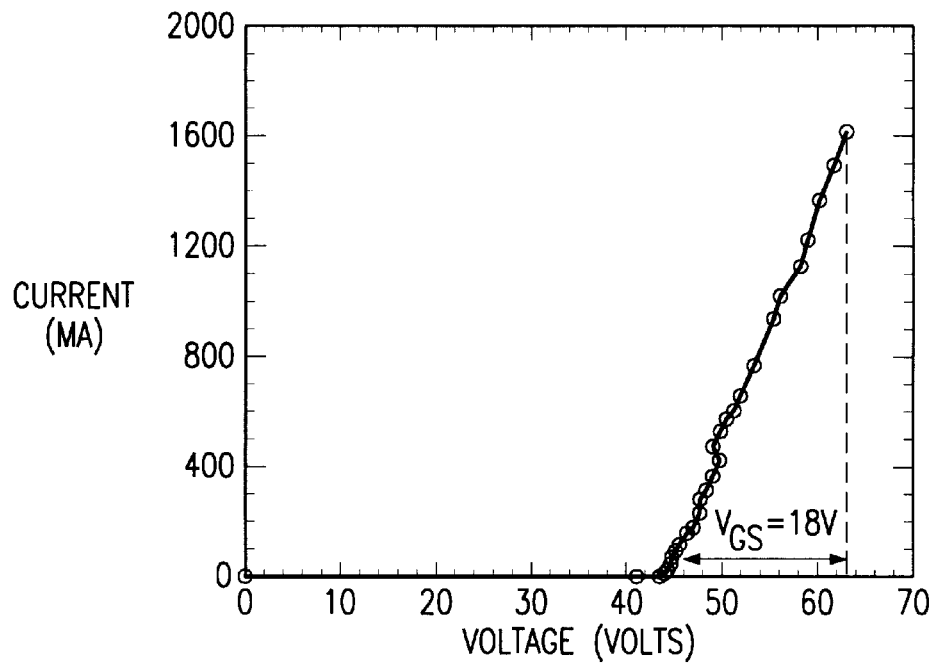
FIG. 7 is a graph of pulsed I–V data for a 2400 micron wide device.

The operation of an output circuit like that of FIG. 4 except without resistors 120 and 124, using specific gate and voltage clamp values will now be discussed. In this example, the drain voltage is clamped at 43 V with a string of Zener diodes and similarly, the gate is clamped at 18 V. The pulsed I-V of a 2400 micron wide LDMOS is shown in FIG. 7. Beyond 44 V (43 V+Vt) the gate turns on and conducts MOS current. As more current is forced the gate potential slowly rises to increase LDMOS conduction until the gate potential reaches 18 V (Vds=44+18) when the gate is clamped by the Zener stack. At this point substantial ESD current of 1.6 A flows through the device. This was validated where the measured HBM-ESD level was 2.2 kV, approximately corresponding to a peak current of 1.5 A.

Although a higher gate clamp can result in a slightly higher ESD level, the practical limit is 20 V. There are several considerations in choosing the gate clamp voltage. First, the sum of the gate clamp voltage and drain clamp voltage must be less than the bipolar breakdown voltage of the LDMOS. The gate clamp voltage must also be less than the gate oxide breakdown voltage. Preferably, however, the gate clamp voltage is very close to the gate oxide breakdown for maximum ESD protection.

On the other hand, the drain clamp voltage should be minimized to lower power dissipation. Under ESD, the LDMOS 102 operates as a saturated MOSFET and therefore, the lower the drain clamp voltage, the better the ESD performance.

Figure 8A:
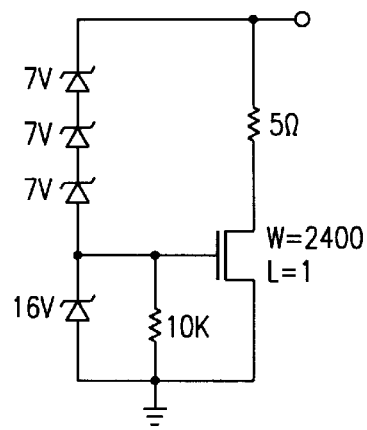
FIGS. 8a–8e are schematic diagrams of various embodiments of the invention.
Figure 8B:
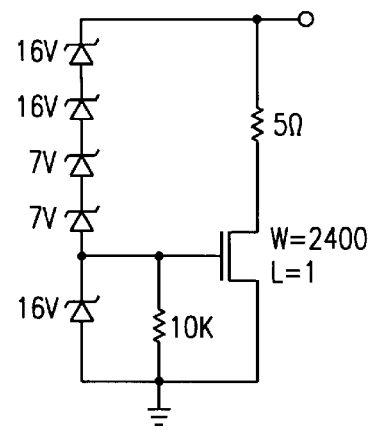
Figure 8C:
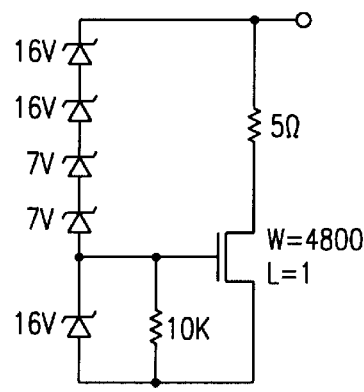
Figure 8D:
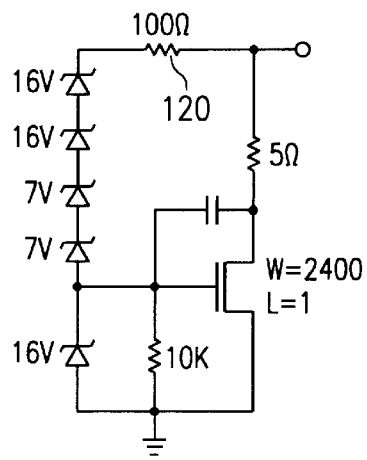
Figure 8E:
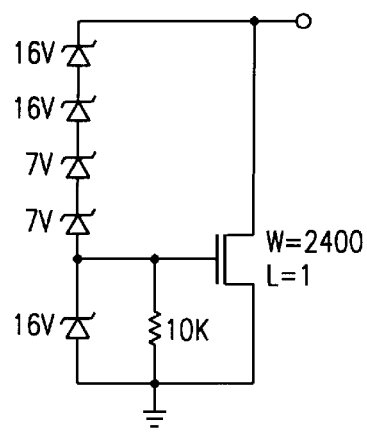

FIGS. 8a–8e are various configuration for the LDMOS output circuit according to the invention. In FIG. 8a, a drain clamp voltage of 21 V and a gate clamp voltage of 16 V is used for a 2400 micron device width. The resulting HBM ESD protection level is 4.2–4.6 kV. The MM protection level is 225 V. If the drain clamp voltage is increased to 46 V (as shown in FIG. 8b), the HBM protection level is cut in half to 2.0–2.4 kV and the MM level reduces to 150 V. With a drain clamp voltage remaining at 46 V, even doubling the device width to 4800 (as shown in FIG. 8c) does not achieve the same ESD protection level as the first example having a drain clamp voltage of 21. FIG. 8d is a 2400 micron wide device having a drain clamp voltage of 46 and a gate clamp voltage of 16. A resistor 120 is added to the drain clamp. Resistor 120 is placed between the drain clamp and the pad. Resistor 120 allows the gate to charge more slowly and thus aids in providing simultaneous operation between along the fingers of a multi-fingered layout for LDMOS 102. Comparing FIG. 8d to 8b, the addition of the resistor 120 causes an increase in the HBM protection level from the range 2.0–2.4 kV to the range 2.6–2.8 kV. The circuit of FIG. 8e has a HBM protection level that varies from 2.0 to 3.0 kV.

Figure 1:
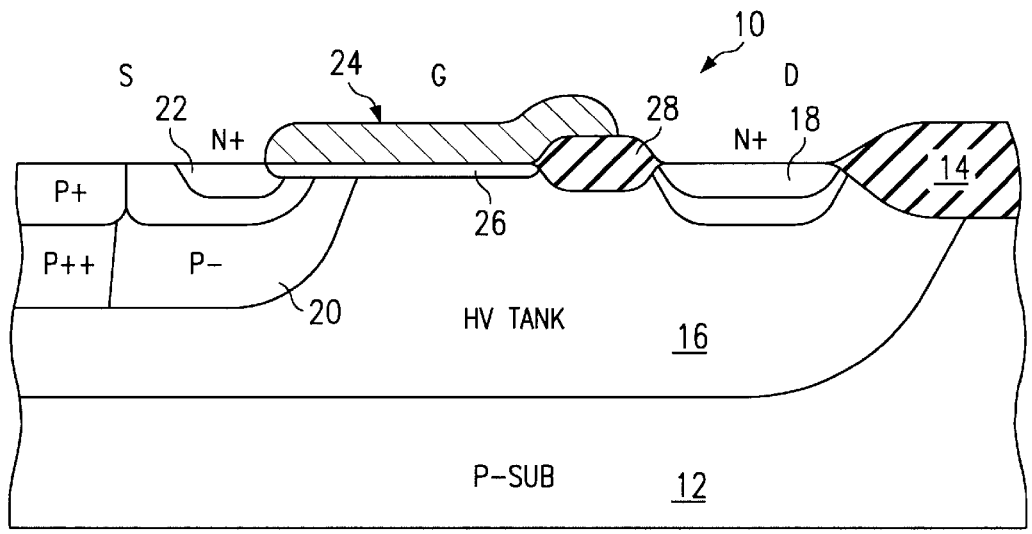
FIG. 1 is a prior art LDMOS transistor.
Figure 2:
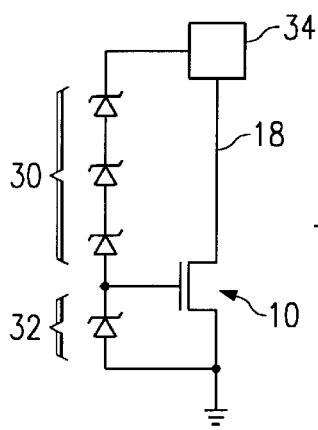
FIG. 2 is a prior art application for the LDMOS transistor of FIG. 1.
Figure 9:
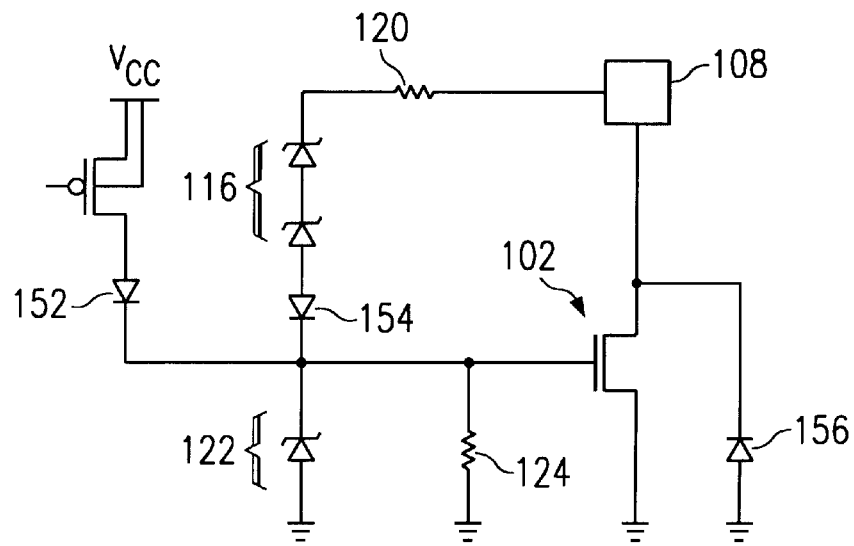
FIG. 9 is a schematic diagram showing the diode to substrate for negative ESD protection.

As in the prior art circuit of FIG. 2, the invention can offer negative ESD protection via an inherent diode 156 to substrate via the body node of the LDMOS transistor 102. This is shown in FIG. 9. The circuit of FIG. 9 is designed so that the protection circuit turns on before the protected circuit as the voltage at the pad 108 rises. Blocking diodes 152 and 154 are included to allow both the normal circuit performance and ESD performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An output circuit comprising:
   a lateral DMOS transistor connected between a pad and a source potential;
   a drain clamp comprising one or more Zener diodes, said drain clamp connected between said pad and a gate of said lateral DMOS transistor;
   a gate clamp comprising one or more Zener diodes, said gate clamp connected between said gate and said source potential;
   wherein a gate clamp voltage level of said gate clamp is close to but less than a gate oxide breakdown voltage and wherein the sum of said gate clamp voltage level and a drain clamp voltage level is less than a bipolar breakdown voltage of said lateral DMOS transistor.

2. The circuit of claim 1, wherein said gate clamp voltage level is in the range of 12–20 volts.

3. The circuit of claim 1, wherein a width (W) of said lateral DMOS, said drain clamp voltage (Vd) and said gate clamp voltage (Vg) are such that the following equation is satisfied:

$$V(ESD-HBM) \leq [0.5W(Vg-Vt)^2]/[(1+0.1(Vg-Vt))Vd],$$

wherein V(ESD-HBM) is a human-body model protection level.

4. The circuit of claim 1, further comprising a first resistor located between said drain clamp and said pad.

5. The circuit of claim 1, further comprising a second resistor located between said gate and said source potential.

6. The circuit of claim 1, wherein given a width (W) of said lateral DMOS, a human body model protection level (ESD–HBM), and said drain clamp voltage level (Vd), said gate clamp voltage level (Vg) is approximately that determined using the following equation:

$$V(ESD-HBM)=[0.5W(Vg-Vt)^2]/[(1+0.1(Vg-Vt))Vd].$$

7. An output circuit comprising:

a lateral DMOS transistor connected between a pad and a source potential;

a drain clamp comprising one or more Zener diodes, said drain clamp connected between said pad and a gate of said lateral DMOS transistor;

a gate clamp comprising one or more Zener diodes for a gate clamp voltage level in the range of 12–20 volts, said gate clamp connected between said gate and said source potential;

wherein given a desired human body model protection level (ESD–HBM) and any two of the following three parameters: LDMOS width (W), drain clamp voltage level (Vd), and gate clamp voltage level(Vg), the third of said three parameters is determined using the following equation:

$$V(ESD-HBM) \leq [0.5W(Vg-Vt)^2]/[(1+0.1(Vg-Vt))Vd].$$

8. The circuit of claim 7, wherein said gate clamp voltage level is less than a gate oxide breakdown voltage of said LDMOS.

9. The circuit of claim 7, wherein the sum of said drain clamp voltage level and said gate clamp voltage level is less than a bipolar breakdown of said LDMOS.

10. The circuit of claim 7, further comprising a first resistor located between said drain clamp and said pad.

11. The circuit of claim 7, further comprising a second resistor located between said gate and said source potential.

12. An output circuit comprising:

a lateral DMOS transistor connected between a pad and a source potential;

a drain clamp comprising one or more Zener diodes, said drain clamp connected between said pad and a gate of said lateral DMOS transistor;

a gate clamp comprising one or more Zener diodes, said gate clamp connected between said gate and said source potential;

wherein a gate clamp voltage level is selected in a range of less than gate oxide breakdown voltage of said lateral DMOS transistor and above this range; no significant further increase in drain current is obtained during normal operation.

13. The circuit of claim 12, wherein said gate clamp voltage level is in the range of 12–20 volts.

14. The circuit of claim 12, wherein a width (W) of said lateral DMOS, said drain clamp voltage (Vd) and said gate clamp voltage (Vg) are such that the following equation is satisfied:

$$V(ESD-HBM) \leq [0.5W(Vg-Vt)^2]/[(1+0.1(Vg-Vt))Vd],$$

where V(ESD–HBM) is a human body model protection level.

15. The circuit of claim 12, further comprising a first resistor located between said drain clamp and said pad.

16. The circuit of claim 12, further comprising a second resistor located between said gate and said source potential.

17. The circuit of claim 12, wherein given a width (W) of said lateral DMOS, a human body model protection level (ESD–HBM), and said drain clamp voltage level (Vd), said gate clamp voltage level (Vg) is approximately that determined using the following equation:

$$V(ESD-HBM)=[0.5W(Vg-Vt)^2]/[(1+0.1(Vg-Vt))Vd].$$

* * * * *